US012717194B2

(12) United States Patent
Um et al.

(10) Patent No.: US 12,717,194 B2
(45) Date of Patent: Aug. 25, 2026

(54) ARRAY SUBSTRATE AND DISPLAY PANEL

(71) Applicants: Huizhou China Star Optoelectronics Display Co., LTD., Huizhou (CN); TCL CHINA STAR OPTOELECTRONICS TECHNOLOGY CO., LTD., Shenzhen (CN)

(72) Inventors: Yoonsung Um, Huizhou (CN); Jing Liu, Huizhou (CN)

(73) Assignees: HUIZHOU CHINA STAR OPTOELECTRONICS DISPLAY CO., LTD., Huizhou (CN); TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 357 days.

(21) Appl. No.: 18/557,946

(22) PCT Filed: May 31, 2023

(86) PCT No.: PCT/CN2023/097609
§ 371 (c)(1),
(2) Date: Oct. 29, 2023

(87) PCT Pub. No.: WO2024/239366
PCT Pub. Date: Nov. 28, 2024

(65) Prior Publication Data

US 2026/0118723 A1 Apr. 30, 2026

(30) Foreign Application Priority Data

May 22, 2023 (CN) ......................... 202310582371.4

(51) Int. Cl.
*G02F 1/1362* (2006.01)
*H10D 86/40* (2025.01)

(52) U.S. Cl.
CPC .. *G02F 1/136209* (2013.01); *G02F 1/136286* (2013.01); *H10D 86/441* (2025.01)

(58) Field of Classification Search
CPC ........ G02F 1/136209; G02F 1/136286; H10D 86/441
See application file for complete search history.

(56) References Cited

U.S. PATENT DOCUMENTS

2024/0014219 A1* 1/2024 Liu .................. G02F 1/136286
2024/0210771 A1* 6/2024 Liu .................. G02F 1/133707

FOREIGN PATENT DOCUMENTS

CN 107272275 A 10/2017
CN 112965284 A 6/2021

(Continued)

OTHER PUBLICATIONS

Chinese Office Action issued in corresponding Chinese Patent Application No. 202310582371.4 dated Mar. 17, 2026, pp. 1-9.

*Primary Examiner* — David Y Chung
(74) *Attorney, Agent, or Firm* — PV IP PC; Wei Te Chung

(57) ABSTRACT

An array substrate and a display panel are provided. A shielding layer of the array substrate includes a first shielding electrode having a same potential as a pixel electrode and a second shielding electrode having a same potential as the pixel electrode. An orthographic projection of the first shielding electrode projected on a base substrate overlaps with an orthographic projection of the pixel electrode projected on the base substrate. An orthographic projection of the second shielding electrode projected on the base substrate covers an orthographic projection of a data line projected on the base substrate, and at least partially overlaps with the orthographic projection of the pixel electrode projected on the base substrate.

20 Claims, 7 Drawing Sheets

(56) References Cited

FOREIGN PATENT DOCUMENTS

| | | | |
|---|---|---|---|
| KR | 20090070234 | A | 7/2009 |
| KR | 20120119299 | A | 10/2012 |

* cited by examiner

102

101

102

ARRAY SUBSTRATE AND DISPLAY PANEL

FIELD OF DISCLOSURE

The present application relates to a field of display technology, in particular to an array substrate and a display panel.

DESCRIPTION OF RELATED ART

In conventional pixel structures (with the addition of a transparent electrode layer to replace DBS-data line black matrix), the transparent electrode layer overlaps with data lines, which can shield the electric fields of the data lines. Moreover, the transparent electrode layer is set on an entire surface and forms a large transparent storage capacitor with the pixel electrode layer, greatly enhancing transmittance and storage capacitance. However, the transparent electrode layer set on the entire surface has an electric field confinement effect, and a lateral electric field is generated between the transparent electrode layer and the pixel electrode, leading to the liquid crystal's tilt state not reaching the desired ideal value and consequently reducing liquid crystal efficiency.

SUMMARY OF INVENTION

The present application provides an array substrate and a display panel that can solve technical problems in conventional array substrates, where a lateral electric field is generated between a transparent electrode layer set on an entire surface and a pixel electrode, resulting in reduced liquid crystal efficiency.

In order to solve the above problems, the technical solutions provided by the present application are as follows:

The present application provides an array substrate, including:

a base substrate;

a first metal layer disposed on the base substrate and comprising a common signal line;

a second metal layer disposed on one side of the first metal layer away from the base substrate and comprising a plurality of data lines;

a pixel electrode layer disposed on one side of the second metal layer away from the first metal layer and comprising a plurality of pixel electrodes; and a shielding layer, disposed between the second metal layer and the pixel electrode layer and comprising a plurality of first shielding electrodes and a plurality of second shielding electrodes arranged at intervals, wherein the first shielding electrode has a same potential as the pixel electrodes, and the second shielding electrode has a same potential as the common signal line, wherein an orthographic projection of the first shielding electrode projected on the base substrate overlaps with an orthographic projection of the pixel electrode projected on the base substrate, and an orthographic projection of the second shielding electrode projected on the base substrate covers an orthographic projection of the data line projected on the base substrate and at least partially overlaps with the orthographic projection of the pixel electrode projected on the base substrate.

In the array substrate of the present application, the array substrate includes a plurality of pixel electrode regions and at least one driving circuit region arranged on one side of each of the pixel electrode regions, wherein the pixel electrodes are disposed in the pixel electrode regions;

wherein the pixel electrode layer further comprises a connecting electrode connected to the pixel electrode and extends from the pixel electrode region to the driving circuit region, and the first shielding electrode is electrically connected to the connecting electrode in the driving circuit region.

In the array substrate of the present application, the first shielding electrode comprises a first sub-shielding electrode and a second sub-shielding electrode extending from one side of the first sub-shielding electrode; the first sub-shielding electrode is arranged in the pixel electrode region, the second sub-shielding electrode is at least arranged in the driving circuit region, and the second sub-shielding electrode is electrically connected to the connecting electrode in the driving circuit region.

In the array substrate of the present application, the second metal layer further comprises a source and a drain disposed at intervals and arranged in each of the driving circuit regions; the source is electrically connected to the data line, the second sub-shielding electrode is electrically connected to the drain through a first via hole, the connecting electrode contacts and connects to the second sub-shielding electrode in the first via hole through a second via hole, and the first via hole is in communication with the second via hole.

In the array substrate of the present application, the array substrate further includes:

a color resist layer formed between the second metal layer and the shielding layer; and an insulation layer disposed between the shielding layer and the pixel electrode layer, wherein the first via hole extends through the color resist layer, and the second via hole extends through the insulation layer.

In the array substrate of the present application, the second shielding electrode includes a third sub-shielding electrode and a fourth sub-shielding electrode, the third sub-shielding electrode and the fourth sub-shielding electrode extend in a direction parallel to the data line and are connected to the data line, the third sub-shielding electrode is arranged on one side of the pixel electrode region, and the fourth sub-shielding electrode is arranged on one side of the driving circuit region; an orthographic projection of the third sub-shielding electrode projected on the base substrate at least partially overlaps with the orthographic projection of the pixel electrode projected on the base substrate.

In the array substrate of the present application, the first metal layer further includes a plurality of scan lines, and the scan lines intersect with the data lines;

the second shielding electrode further comprises a fifth sub-shielding electrode parallel to the scan line and connected to the third sub-shielding electrode; the third sub-shielding electrode, the fourth sub-shielding electrode, and the fifth sub-shielding electrode are connected to form a grid pattern; each of the first shielding electrodes is arranged in one grid;

wherein an orthographic projection of the fifth sub-shielding electrode projected on the base substrate covers an orthographic projection of the scan line projected on the base substrate.

In the array substrate of the present application, a width of an area of overlap between the orthographic projection of the third sub-shielding electrode projected on the base substrate and the orthographic projection of the pixel electrode projected on the base substrate is greater than 5 micrometers.

In the array substrate of the present application, a ratio of an area of the first sub-shielding electrode to an area of the pixel electrode ranges from 30% to 85%.

In the array substrate of the present application, a minimum spacing between the third sub-shielding electrode and the first sub-shielding electrode ranges from 4 micrometers to 10 micrometers.

In the array substrate of the present application, the array substrate further includes a third via hole, and the second shielding electrode and the common signal line are electrically connected to each other through the third via hole.

The present application provides a display panel, including:

an array substrate;

a color filter substrate disposed opposite to the array substrate; and a liquid crystal layer disposed between the array substrate and the color filter substrate, wherein the array substrate comprises:

a base substrate;

a first metal layer disposed on the base substrate and comprising a common signal line;

a second metal layer disposed on one side of the first metal layer away from the base substrate and including a plurality of data lines;

a pixel electrode layer disposed on one side of the second metal layer away from the first metal layer and including a plurality of pixel electrodes; and a shielding layer, wherein the shielding layer is disposed between the second metal layer and the pixel electrode layer and includes a plurality of first shielding electrodes and a plurality of second shielding electrodes arranged at intervals, and the first shielding electrode has a same potential as the pixel electrode, and the second shielding electrodes has a same potential as the common signal line, wherein an orthographic projection of the first shielding electrode projected on the base substrate overlaps with an orthographic projection of the pixel electrode projected on the base substrate, and an orthographic projection of the second shielding electrode projected on the base substrate covers an orthographic projection of the data line projected on the base substrate and at least partially overlaps with the orthographic projection of the pixel electrode on the base substrate.

In the display panel of the present application, the array substrate further includes a plurality of pixel electrode regions and at least one driving circuit region arranged on one side of each of the pixel electrode regions, wherein the pixel electrodes are disposed in the pixel electrode regions;

wherein the pixel electrode layer further includes a connecting electrode connected to the pixel electrode and extends from the pixel electrode region to the driving circuit region, and the first shielding electrode is electrically connected to the connecting electrode in the driving circuit region.

In the display panel of the present application, the first shielding electrode includes a first sub-shielding electrode and a second sub-shielding electrode extending from one side of the first sub-shielding electrode; the first sub-shielding electrode is arranged in the pixel electrode region, the second sub-shielding electrode is at least arranged in the driving circuit region, and the second sub-shielding electrode is electrically connected to the connecting electrode in the driving circuit region.

In the display panel of the present application, the second metal layer further includes a source and a drain disposed at intervals and arranged in each of the driving circuit regions; the source is electrically connected to the data line, the second sub-shielding electrode is electrically connected to the drain through a first via hole, the connecting electrode contacts and connects to the second sub-shielding electrode in the first via hole through a second via hole, and the first via hole is in communication with the second via hole.

In the display panel of the present application, the array substrate further includes: a color resist layer formed between the second metal layer and the shielding layer; and an insulation layer disposed between the shielding layer and the pixel electrode layer, wherein the first via hole extends through the color resist layer, and the second via hole extends through the insulation layer.

In the display panel of the present application, the second shielding electrode includes a third sub-shielding electrode and a fourth sub-shielding electrode, the third sub-shielding electrode and the fourth sub-shielding electrode extend in a direction parallel to the data line and are connected to the data line, the third sub-shielding electrode is arranged on one side of the pixel electrode region, and the fourth sub-shielding electrode is arranged on one side of the driving circuit region; an orthographic projection of the third sub-shielding electrode projected on the base substrate at least partially overlaps with the orthographic projection of the pixel electrode projected on the base substrate.

In the display panel of the present application, the first metal layer further includes a plurality of scan lines, and the scan lines intersect with the data lines;

the second shielding electrode further comprises a fifth sub-shielding electrode parallel to the scan line and connected to the third sub-shielding electrode; the third sub-shielding electrode, the fourth sub-shielding electrode, and the fifth sub-shielding electrode are connected to form a grid pattern; each of the first shielding electrodes is arranged in one grid;

wherein an orthographic projection of the fifth sub-shielding electrode projected on the base substrate covers an orthographic projection of the scan line projected on the base substrate.

According to the display panel provided in the present application, a width of an area of overlap between the orthographic projection of the third sub-shielding electrode projected on the base substrate and the orthographic projection of the pixel electrode projected on the base substrate is greater than 5 micrometers.

According to the display panel provided in the present application, a ratio of an area of the first sub-shielding electrode to an area of the pixel electrode ranges from 30% to 85%.

Advantages

Advantages of the present application: In the array substrate and display panel provided by embodiments of the present application, a shielding layer arranged on an entire surface is divided into two parts, namely a plurality of first shielding electrodes arranged at intervals and a plurality of second shielding electrodes arranged at intervals. The first shielding electrode has a same potential as a pixel electrode. An orthographic projection of the first shielding electrode projected on the base substrate overlaps with an orthographic projection of the pixel electrode projected on the base substrate. There is no voltage difference between the first shielding electrode and the pixel electrode, thus preventing generation of any lateral electric field between the first shielding electrode and the pixel electrode that can cause an impact on an angle of deflection of liquid crystals. At the same time, the second shielding electrode has a same potential as a common signal line, and an orthographic projection of the second shielding electrode projected on the base substrate covers an orthographic projection of a data line projected on the base substrate and at least partially overlaps with the orthographic projection of the pixel electrode projected on the base substrate. This arrangement is conducive to increasing the storage capacitance between the second shielding electrode and the pixel electrode and improving the transmittance. In this way, the transmittance and the liquid crystal efficiency are both ensured.

BRIEF DESCRIPTION OF DRAWINGS

In order to more clearly illustrate the technical solutions of the present application, drawings which will be described in the embodiments are briefly introduced hereinafter. It is obvious that the drawings are merely for the purposes of illustrating some embodiments of the present disclosure, and persons having ordinary skill in this field can obtain other drawings according to these drawings without inventive work.

DETAILED DESCRIPTION OF EMBODIMENTS

Figure 1:
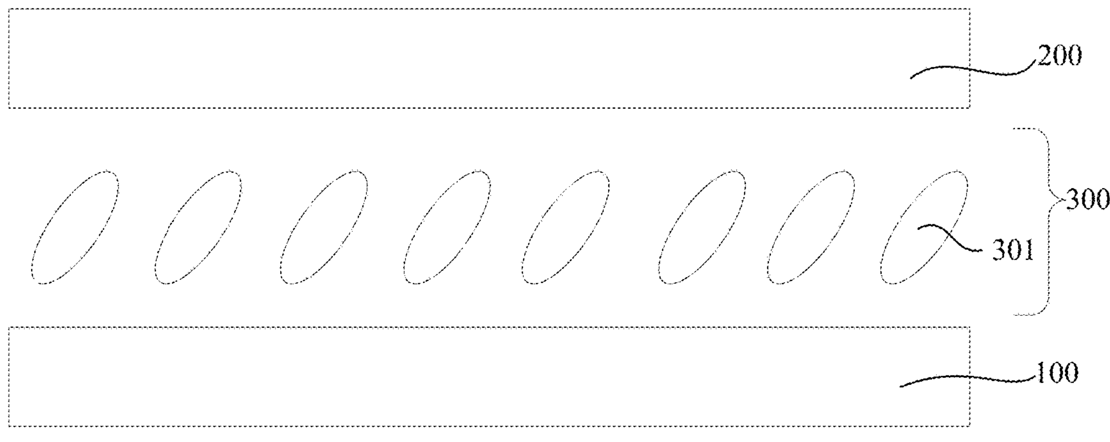
FIG. 1 is a schematic view illustrating a cross-sectional structure of a display panel according to one embodiment of the present application.

The technical solutions of the present application are clearly and completely described below in conjunction with the accompanying drawings and with reference to specific embodiments. Certainly, the described embodiments are only some of the embodiments of this application, but not all of them. Based on the embodiments in the present application, all other embodiments obtained by those skilled in the art without creative effort should be deemed to fall within the protection scope of the present application.

In the description of the present application, it should be understood that the orientations or positional relationships indicated by the terms "upper" and "lower" are based on the orientations or positional relationships shown in the drawings, and the above orientations or positional relationships are only for the convenience of describing the present application and simplifying the description, but do not indicate or imply that the device or element must have a specific orientation, be constructed and operated in a specific orientation, and thus should not be construed as limiting the present application. In addition, the terms "first", "second", etc. are used for illustrative purposes only, and should not be understood as indicating or implying relative importance or implicitly specifying the quantity of the indicated technical features. Thus, a feature defined as "first" or "second" may explicitly or implicitly include one or more of said features. In the description of the present application, "multiple" means two or more, unless otherwise clearly and specifically defined.

The present application may repeat reference numbers and/or reference letters in different embodiments, such repetition is for simplicity and clarity and does not indicate a relationship between the various embodiments and/or arrangements discussed.

An array substrate and a display panel provided by the present application will be described in detail below in conjunction with specific embodiments and with reference to the accompanying drawings.

Referring to FIG. 1, the present application provides a display panel. The display panel includes an array substrate 100, a color filter substrate 200, and a liquid crystal layer 300. The array substrate 100 and the color filter substrate 200 are disposed opposite to each other, and the liquid crystal layer 300 is arranged between the color filter substrate 200 and the array substrate 100. The liquid crystal layer 300 includes a plurality of liquid crystal molecules 301. There is a voltage difference between the array substrate 100 and the color filter substrate 200, the voltage difference can drive liquid crystal molecules 301 in the liquid crystal layer 300 to rotate, thereby realizing image display.

Figure 2:
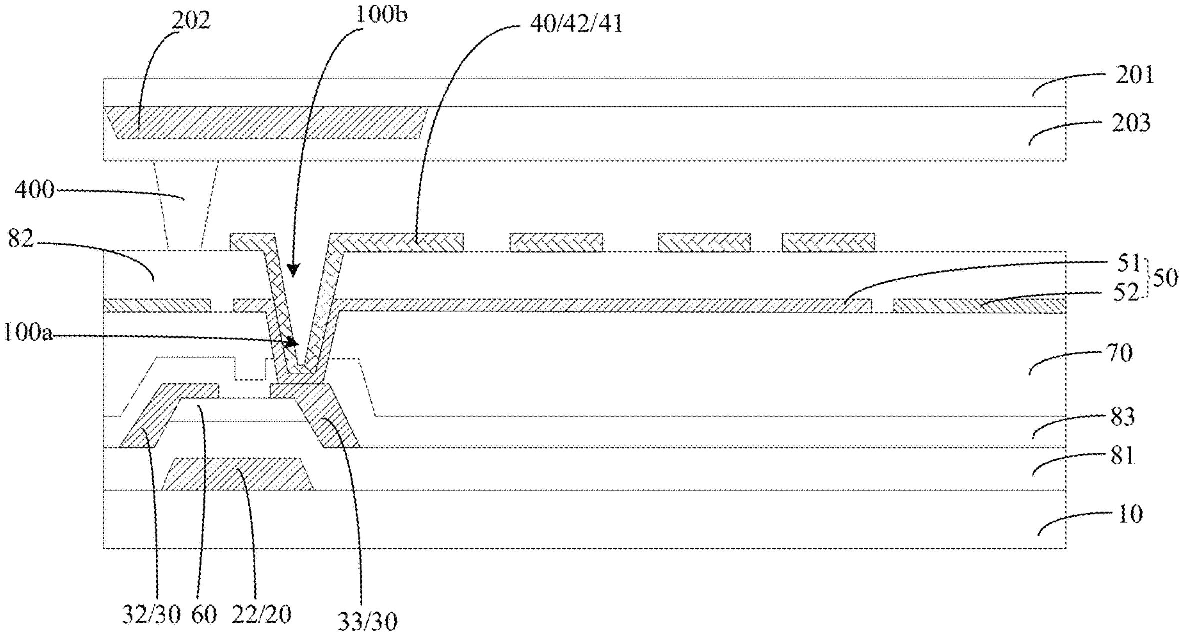
FIG. 2 is a schematic view illustrating a film layer structure of the display panel according to one embodiment of the present application.
Figure 3:
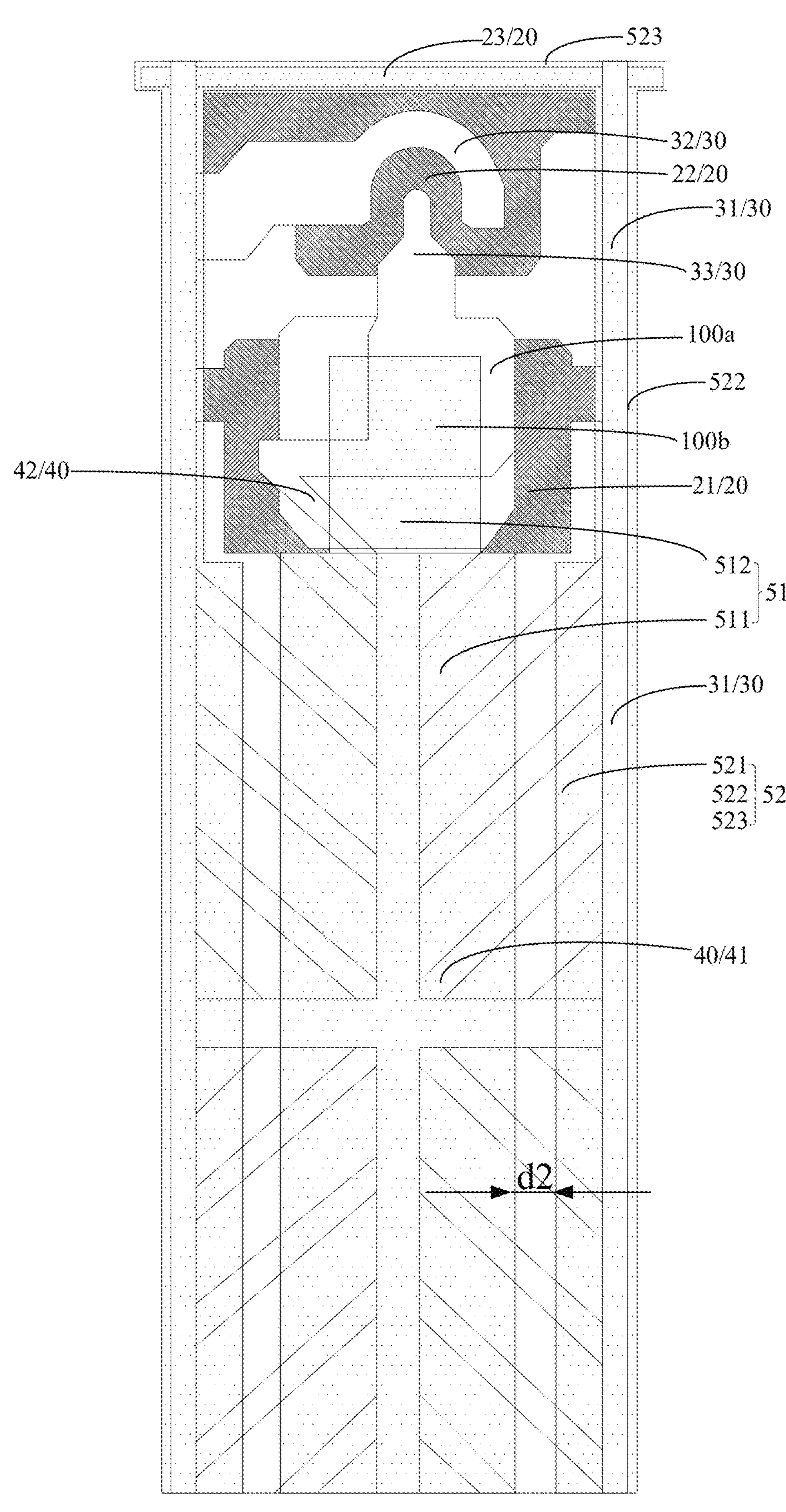
FIG. 3 is a schematic plan view of an array substrate according to one embodiment of the present application.
Figures 4, 5:
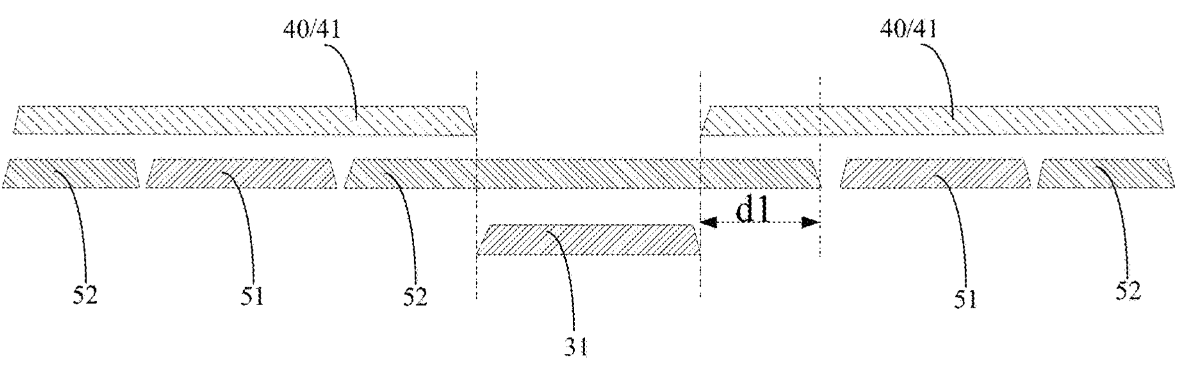
FIG. 4 is a schematic view illustrating a positional relationship among a data line, a pixel electrode, and a shielding layer of the array substrate in FIG. 3.
FIG. 5 is a schematic view of a positional relationship between a pixel electrode region and a driving circuit region of the array substrate in FIG. 3.

Referring to FIGS. 2, 3, and 4, the present application provides an array substrate 100. The array substrate 100 includes a base substrate 10, a first metal layer 20, a second metal layer 30, a pixel electrode layer 40, and a shielding layer 50.

The first metal layer 20 is disposed on the base substrate 10 and includes a common signal line 21. The second metal layer 30 is disposed on one side of the first metal layer 20 away from the base substrate 10 and includes a plurality of data lines 31. The pixel electrode layer 40 is disposed on one side of the second metal layer 30 away from the first metal layer 20 and includes a plurality of pixel electrodes 41 arranged at intervals. The shielding layer 50 is disposed between the second metal layer 30 and the pixel electrode layer 40 and includes a plurality of first shielding electrodes 51 and a plurality of second shielding electrodes 52 arranged at intervals. The first shielding electrode 51 has a same potential as the pixel electrode 41, and the second shielding electrode 52 has a same potential as the common signal line 21. An orthographic projection of the first shielding electrode 51 projected on the base substrate 10 overlaps with an orthographic projection of the pixel electrode 41 projected on the base substrate 10. An orthographic projection of the second shielding electrode 52 projected on the base substrate 10 covers an orthographic projection of the data line 31 projected on the base substrate 10, and at least partially overlaps with an orthographic projection of the pixel electrode 41 projected on the base substrate 10.

It can be understood that the second shielding electrode 52 has the same potential as the common signal line 21, and the orthographic projection of the second shielding electrodes 52 projected on the base substrate 10 covers the orthographic projection of the data lines 31 projected on the base substrate 10, so that there is no voltage difference between each second shielding electrode 52 and the color filter substrate 200, thereby ensuring that the liquid crystals above the data lines 31 are in a dark state, acting as a black matrix to prevent light leakage on two sides of each data line 31. Further, the orthographic projection of the second shielding electrode 52 projected on the base substrate 10 at least partially overlaps with the orthographic projection of the pixel electrode 41 projected on the base substrate 10, thus increasing a storage capacitance between the pixel electrode 41 and the shielding layer 50, which is beneficial to improve the transmittance.

At the same time, the first shielding electrode 51 and the pixel electrode 41 have the same potential, so that there is no voltage difference between the first shielding electrode 51 and the pixel electrode 41. This prevents the generation of a lateral electric field between them that could impact the liquid crystal deflection angle, thus contributing to an enhancement in liquid crystal efficiency. In this manner, both transmittance and liquid crystal efficiency are guaranteed.

In one embodiment of the present application, the orthographic projection of the pixel electrode 41 projected on the base substrate 10 covers the orthographic projection of the first shielding electrode 51 on the base substrate 10.

The pixel electrode 41 is transparent, and a material of the pixel electrode 41 is indium tin oxide (ITO). Of course, the material of the pixel electrode 41 is not limited to ITO, but can also be other transparent electrode materials.

In one embodiment of the present application, the shielding layer 50 is also transparent, preventing any obstruction to the backlight provided by the backlight module located on one side of the array substrate 100.

In one embodiment of the present application, referring to FIG. 5, the array substrate 100 includes at least one pixel electrode region 101 and at least one driving circuit region 102. The driving circuit region 102 is arranged on one side of the pixel electrode region 101. The pixel electrode region 101 is configured to arrange the pixel electrode 41, and the driving circuit region 102 is configured to arrange a driving circuit for driving the deflection of the liquid crystals. In the present embodiment, the number of the pixel electrode regions 101 is at least two, and one driving circuit region 102 is arranged between two adjacent pixel electrode regions 101.

In one embodiment of the present application, with reference to FIG. 2 and FIG. 5, the pixel electrode layer 40 further includes a connecting electrode 42 that extends from the pixel electrode region 101 to the driving circuit region 102 and is connected to the pixel electrode 41. The first shielding electrode 51 is electrically connected to the connecting electrode 42 in the driving circuit region 102. Without affecting an aperture ratio of the pixel electrode 41, this arrangement ensures that the first shielding electrode 51 has the same potential as the pixel electrode 41.

Figure 6:
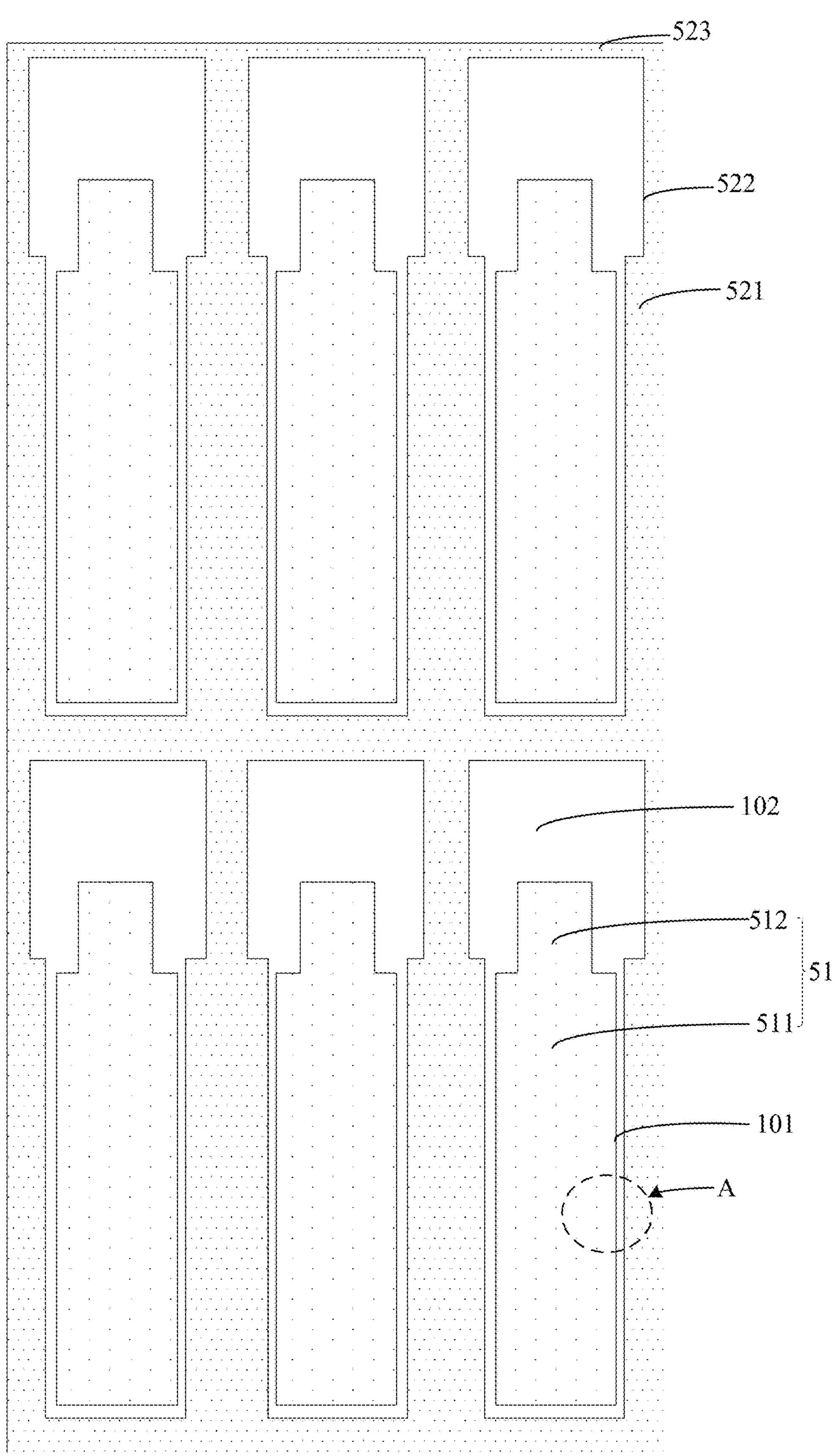
FIG. 6 is a schematic view of a first plane structure of the shielding layer of the array substrate in FIG. 3.

Specifically, in one embodiment of the present application, with reference to FIG. 2 and FIG. 6, the first shielding electrode 51 includes a first sub-shielding electrode 511 and a second sub-shielding electrode 512 that extends from one side of the first sub-shielding electrode 511. The first sub-shielding electrode 511 is arranged in the pixel electrode region 101, the second sub-shielding electrode 512 is arranged at least in the driving circuit region 102, and the second sub-shielding electrode 512 is electrically connected to the connecting electrode 42 in the driving circuit region 102. In the present embodiment, the second sub-shielding electrode 512 is completely arranged in the driving circuit region 102.

Optionally, a shape of an orthographic projection of the second sub-shielding electrode 512 projected on the base substrate 10 can include one of a rectangle, a diamond shape, a triangular regular shape, or an irregular shape. The shape of the second sub-shielding electrode 512 is not limited to the structure described above. In the present embodiment, the shape of the orthographic projection of the second sub-shielding electrode 512 projected on the base substrate 10 is rectangular.

It should be noted that there are various ways to achieve the configuration where the first shielding electrode 51 shares the same potential as the pixel electrode 41. For instance, in one embodiment, the first shielding electrode 51 is electrically connected to and receives the same signal as the pixel electrode 41. In another embodiment, there might be no direct connection between the first shielding electrode 51 and the pixel electrode 41, but both are connected to the same signal. Specifically, the first shielding electrode 51 is connected to a signal line, which is the same signal line as the one connected to the pixel electrode 41. In yet another embodiment, there might be no direct connection between the first shielding electrode 51 and the pixel electrode 41, and they may be connected to different signals, but they share the same potential. Specifically, the first shielding electrode 51 is connected to a signal line, which is a different signal line from the one connected to the pixel electrode 41.

Hereinafter, the present application's embodiment is described using the example where the first shielding electrode 51 is electrically connected to and receives the same signal as the pixel electrode 41. However, it should be noted that other embodiments are also within the protection scope of the technical solutions provided by this application.

In one embodiment of the present application, with reference to FIGS. 2, 3, 4, 5, and FIG. 6, the second metal layer 30 further includes a source 32 and a drain 33 which are spaced apart and located in the driving circuit region 102. The source 32 is electrically connected to the data line 31. The second sub-shielding electrode 512 is electrically connected to the drain 33 through a first via hole 100*a*. The pixel electrode 41 contacts and connects to the second sub-shielding electrode 512 in the first via hole 100*a* through the second via hole 100*b*. The first via hole 100*a* is in communication with the second via hole 100*b*. In this configuration, the data signal sequentially enters the source 32, the drain 33, the second sub-shielding electrode 512, the connecting electrode 42, and the pixel electrode 41 through the data line 31. The second sub-shielding electrode 512 and the pixel electrode 41 receive the same data signal. Therefore, no voltage difference exists between the second sub-shielding electrode 512 and the pixel electrode 41, preventing generation of a lateral electric field. The liquid crystal molecules 301 arranged directly above the second sub-shielding electrode 512 are affected only by a vertical electric field formed between the pixel electrode 41 and a common electrode of the color filter substrate 200, without being influenced by the lateral electric field. This allows the liquid crystal molecules 301 to achieve the expected deflection angle, contributing to an enhancement in liquid crystal efficiency.

In the present embodiment, the first via hole 100*a* and the second via hole 100*b* overlap in a thickness direction of the array substrate 100 to reduce the space occupied by the first via hole 100*a* and the second via hole 100*b* within the driving circuit region 102, thus leaving sufficient room for the layout of multiple traces in a driving circuit. This reduces an area of the driving circuit region 102, and increases an area of the pixel electrode region 101, thereby further improving the aperture ratio.

In other embodiments, the connecting electrode 42 can also be electrically connected to the drain 33 through a via hole, and the connecting electrode 42 is electrically connected to the second sub-shielding electrode 512 through another via hole. Alternatively, the connecting electrode 42 is electrically connected to the drain 33 through a via hole, and the second sub-shielding electrode 512 is electrically connected to the drain 33 through a via hole.

In one embodiment of the present application, the first metal layer 20 further includes a plurality of scan lines 23 and a gate 22. The scan lines 23 intersect with the data lines 31. An extension direction of the scan lines 23 is perpendicular to an extension direction of the data lines 31. An area enclosed by adjacent two scan lines 23 and adjacent two data lines 31 defines a sub-pixel. Each sub-pixel includes one pixel electrode region 101 and one driving circuit region 102. In the present embodiment, the scan lines 23 extend in the X direction and are spaced apart along the Y direction, and the data lines 31 extend in the Y direction and are spaced apart along the X direction.

Wherein, the scan line 23 is electrically connected to the gate 22, and the source 32 and the drain 33 are arranged opposite to the gate 22. The array substrate 100 further includes a gate insulation layer 81 and an active layer 60 arranged on one side of the first metal layer 20, the gate insulation layer 81 covers the first metal layer 20, and the active layer 60 is arranged on one side of the gate insulation layer 81 away from the base substrate 10. The array substrate 100 further includes a plurality of transistors. Each transistor includes one gate 22, one active layer 60, one source 32 positioned opposite to the gate 22, one drain 33 positioned opposite to the gate 22, and the active layer 60. Scanning signals enter the gates 22 from the scan lines 23 to control the opening and closing of the transistors. Common signals enter the first shielding electrodes 51 from the common signal line 21, causing the first shielding electrode 51 to share the same common signal with the common electrode layer 203 of the color filter substrate 200. There is no voltage difference between the first shielding electrode 51 and the common electrode layer 203.

In one embodiment of the present application, the array substrate 100 further includes a color resist layer 70 and an insulation layer 82. The color resist layer 70 is formed between the second metal layer 30 and the shielding layer 50. The insulation layer 82 is disposed between the shielding layer 50 and the pixel electrode layer 40. The first via hole 100*a* extends through the color resist layer 70, and the second via hole 100*b* extends through the insulation layer 82. The color resist layer 70 includes a plurality of color resist blocks. The color resist blocks include blue color resist blocks, red color resist blocks, and green color resist blocks.

In one embodiment of the present application, the array substrate 100 further includes a passivation layer 83. The passivation layer 83 covers the second metal layer 30, and the color resist layer 70 is arranged on one side of the passivation layer 83 away from the base substrate 10. The first via hole 100*a* extends through the color resist layer 70 and the passivation layer 83. In the present embodiment, a material of the passivation layer 83 includes an inorganic material, and the inorganic material can include one of silicon nitride, silicon oxide, or silicon oxynitride or a combination thereof.

In one embodiment of the present application, the second shielding electrode 52 includes a third sub-shielding electrode 521 and a fourth sub-shielding electrode 522 parallel to and connected to the data lines 31. The third sub-shielding electrode 521 is arranged on one side of the pixel electrode region 101, and the fourth sub-shielding electrode 522 is arranged on one side of the driving circuit region 102. An orthographic projection of the third sub-shielding electrode 521 projected on the base substrate 10 overlaps at least partially with the orthographic projection of the pixel electrode 41 projected on the base substrate 10. That is to say, the third sub-shielding electrode 521 overlaps with the data line 31 and the pixel electrode 41. The portion of the third sub-shielding electrode 521 that overlaps with the data line 31 is intended to prevent light leakage from the data line 31. The portion of the third sub-shielding electrode 521 that overlaps with the pixel electrode 41 is used to form a storage capacitor between the third sub-shielding electrode 521 and the pixel electrode 41 to improve the transmittance.

Wherein, the fourth sub-shielding electrode 522 overlaps with a portion of the data line 31 to prevent light leakage from the data line 31.

In one embodiment of the present application, the second shielding electrode 52 further includes a fifth sub-shielding electrode 523 parallel to the scan line 23 and connected to the third sub-shielding electrode 521. The third sub-shielding electrode 521, the fourth sub-shielding electrode 522, and the fifth sub-shielding electrode 523 are connected to form a grid pattern. Each first shielding electrode 51 is positioned within a grid. Specifically, the first sub-shielding electrode 511 and the second sub-shielding electrode 512 are both positioned within the same grid.

In one embodiment of the present application, an orthographic projection of the fifth sub-shielding electrode 523 projected on the base substrate 10 covers the orthographic projection of the scan line 23 projected on the base substrate 10 for shielding the scan line 23, thereby ensuring that the liquid crystals above the scan line 23 is in a dark state, acting as a black matrix to prevent light leakage on two sides of the scan line 23.

It can be understood that if an area of overlap between the second shielding electrode 52 and the pixel electrode 41 is too large, that is, the area of overlap between the first shielding electrode 51 and the pixel electrode 41 is too small, a storage capacitance between the second shielding electrode 52 and the pixel electrode 41 becomes larger, resulting in higher transmittance. However, the first shielding electrode 51 has no obvious effect on the improvement of the lateral electric field formed between the first shielding electrode 51 and the pixel electrode 41, leading to reduced liquid crystal efficiency. If the area of overlap between the second shielding electrode 52 and the pixel electrode 41 is too small, that is, the area of overlap between the first shielding electrode 51 and the pixel electrode 41 is too large, the first shielding electrode 51 has a more obvious effect on the improvement of the lateral electric field formed between it and the pixel electrode 41, resulting in high liquid crystal efficiency. However, the storage capacitance between the second shielding electrode 52 and the pixel electrode 41 becomes smaller, leading to lower transmittance. Therefore, there needs to be a balance between the area of overlap between the second shielding electrode 52 and the pixel electrode 41, as well as the area of overlap between the first shielding electrode 51 and the pixel electrode 41, in order to simultaneously ensure both high transmittance and liquid crystal efficiency.

In view of this, in one embodiment of the present application, as shown in FIG. 4, a width d1 of the area of overlap between the orthographic projections of the third sub-shielding electrode 521 and the pixel electrode 41 projected on the substrate 10 is greater than 5 micrometers. Further, a ratio of an area of the first sub-shielding electrode 511 to an area of the pixel electrode 41 ranges from 30%-85% to ensure high transmittance and liquid crystal efficiency.

Figure 7:
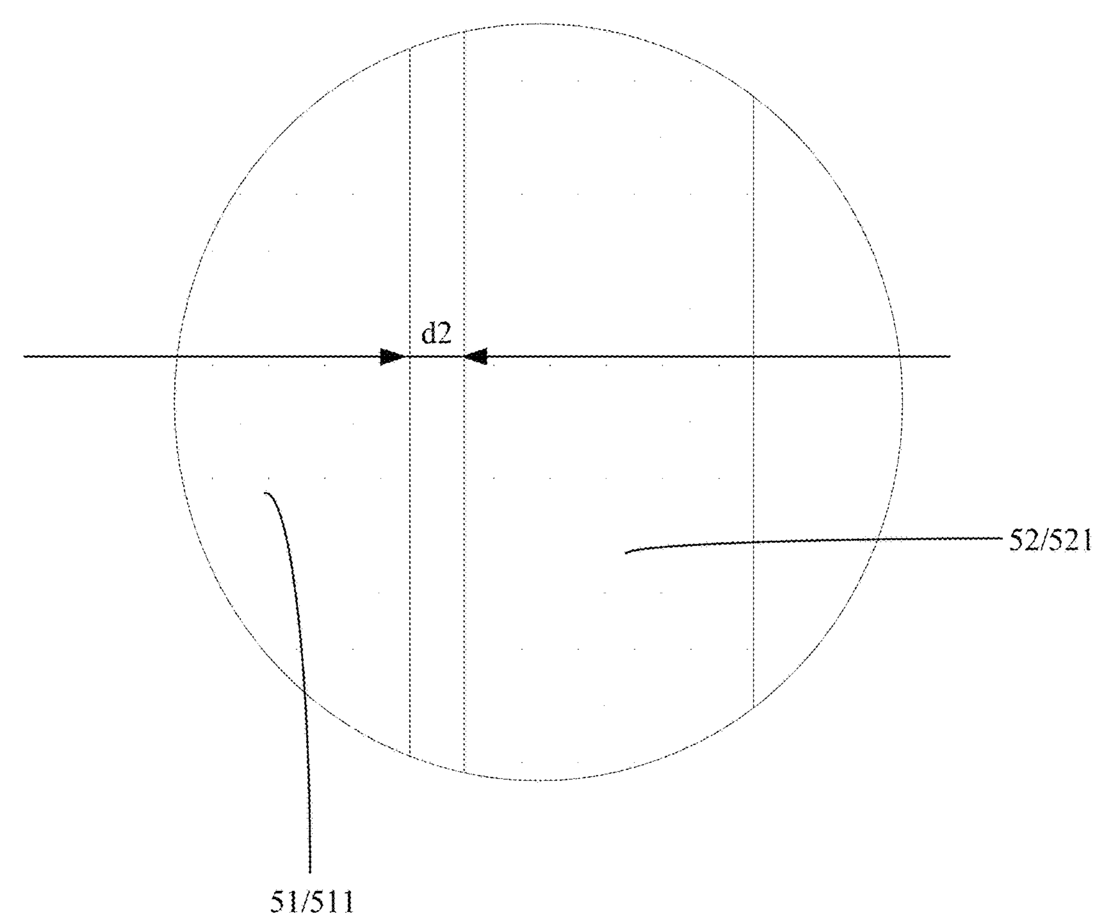
FIG. 7 is a schematic view of a partially enlarged structure at position A in FIG. 6.

In one embodiment of the present application, with reference to FIGS. 2 and 7, a minimum spacing d2 between the third sub-shielding electrode 521 and the first sub-shielding electrode 511 ranges from 4 micrometers to 10 micrometers, to prevent short-circuiting between the third sub-shielding electrode 521 and the first sub-shielding electrode 511 co-located on the same layer.

Figure 8:
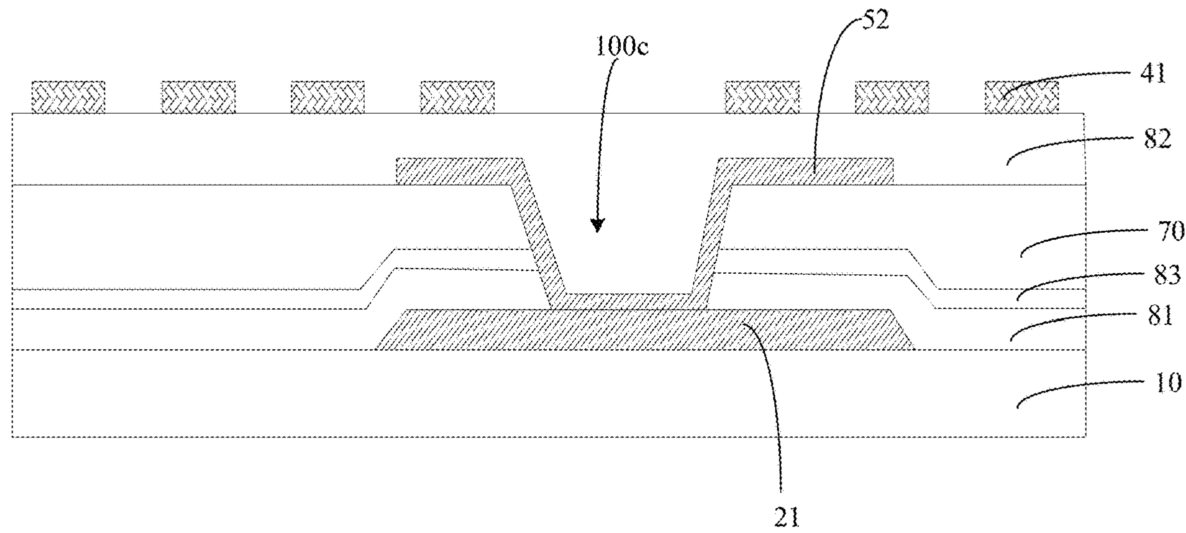
FIG. 8 is a cross-sectional view of the array substrate of FIG. 3, taken through a third via hole.

In one embodiment of the present application, with reference to FIG. 8, the array substrate 100 further includes a third via hole 100*c*, the second shielding electrode 52 and the common signal line 21 are electrically connected through the third via hole 100*c*. The third via hole 100*c* penetrates the color resist layer 70, the passivation layer 83, and the gate insulation layer 81.

The common signal line 21 includes a first common signal line and a second common signal line. The first common signal line is connected perpendicular to the second common signal line. One of the first common signal line and the second common signal line is parallel to the data line 31. The second shielding electrode 52 is electrically connected to either the first common signal line or the second common signal line through the third via hole 100*c*. In one embodiment of the present application, the third via hole 100*c* can be arranged in the driving circuit region 102.

Figure 9:
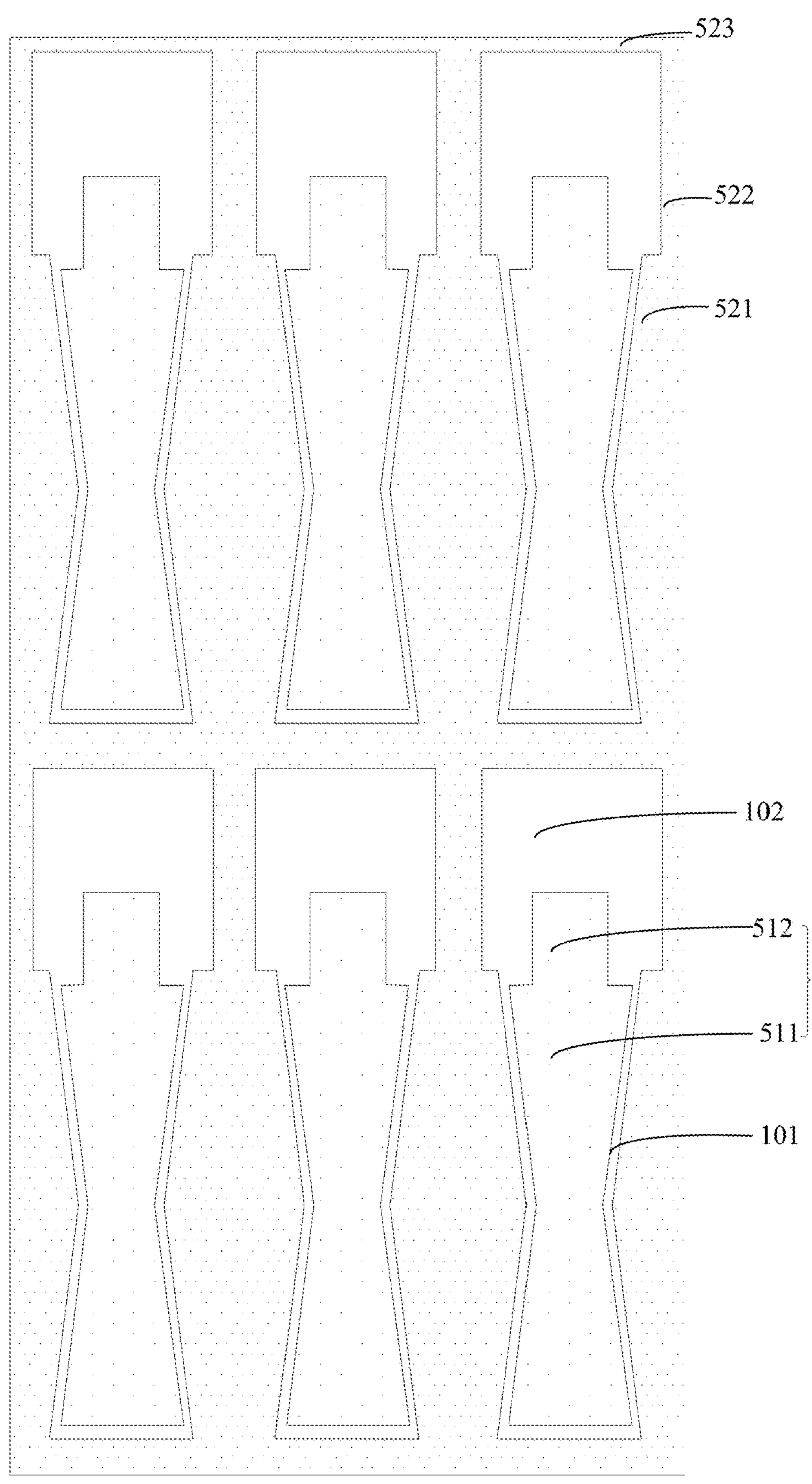
FIG. 9 is a schematic view of a second plane structure of the shielding layer of the array substrate in FIG. 3.
Figure 10:
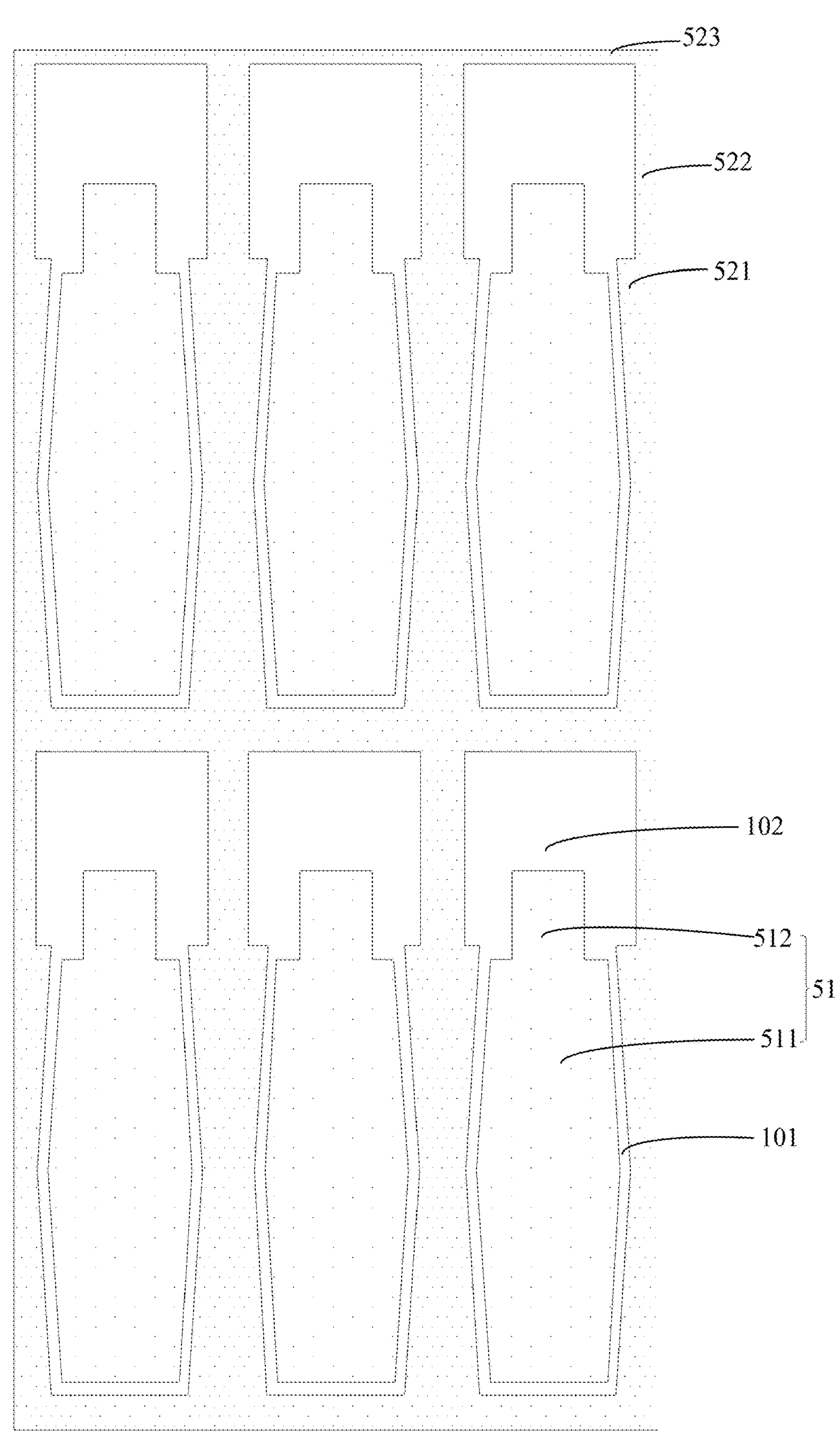
FIG. 10 is a schematic view of a third plane structure of the shielding layer of the array substrate in FIG. 3.

In one embodiment of the present application, a shape of the orthographic projection of the first sub-shielding electrode 511 projected on the base substrate 10 includes one of a rectangle, a diamond, a triangle regular pattern, or an irregular shape. The shape of the first sub-shielding electrode 511 is not limited to the structure mentioned above. Specifically, as shown in FIG. 6, the shape of the orthographic projection of the first sub-shielding electrode 511 projected on the base substrate 10 is rectangular. As shown in FIG. 9, the shape of the orthographic projection of the first sub-shielding electrode 511 projected on the base substrate 10 is diamond-shaped. As shown in FIG. 10, the shape of the orthographic projection of the first sub-shielding electrode 511 projected on the base substrate 10 is hexagonal, wherein the hexagon is composed of two isosceles trapezoids, specifically, a regular isosceles trapezoid and an inverted isosceles trapezoid.

In one embodiment of the present application, with reference to FIGS. 1 and 2, the color filter substrate 200 includes a color filter substrate 201, a patterned black matrix layer 202 formed on the color filter substrate 201, and a common electrode formed on the color filter substrate 201 and covering the black matrix layer 202. The common electrode faces the pixel electrode layer 40.

A support column 400 is disposed between the array substrate 100 and the color filter substrate 200. The support column 400 is arranged corresponding to the black matrix layer 202 to provide a support function.

Beneficial Effects: In the array substrate and the display panel provided in the present application, the shielding layer set across an entire surface is divided into two parts: the plurality of first shielding electrodes and the plurality of second shielding electrodes arranged at intervals. The first shielding electrode and the pixel electrode have the same potential. The orthographic projection of the first shielding electrode projected on the base substrate overlaps with the orthographic projection of the pixel electrode projected on the base substrate. There is no voltage difference between the first shielding electrode and the pixel electrode, thus preventing occurrence of any lateral electric field between the first shielding electrode and the pixel electrode that could affect the deflection angle of the liquid crystals. At the same time, the second shielding electrode has the same potential as the common signal line. The orthographic projection of the second shielding electrode projected on the base substrate covers the orthographic projection of the data line on the base substrate, and at least partially overlaps with the orthographic projection of the pixel electrode projected on the base substrate. This arrangement is advantageous for increasing the storage capacitance between the second shielding electrode and the pixel electrode, thereby enhancing the transmittance. In this way, both the transmittance and the liquid crystal efficiency are guaranteed.

In the above embodiments, the description of each embodiment has its own emphasis. For those that are not described in detail in one embodiment, reference may be made to relevant descriptions of other embodiments.

The above is a detailed description about an array substrate and a display panel according to one embodiment of the present application. In the present disclosure, specific examples are used to illustrate the principles and embodiments of the present application. The descriptions of the above embodiments are only used for ease of understanding the technical solutions and main ideas of the present application. Those skilled in the art should understand that they can still modify the technical solutions described in the foregoing embodiments, or perform equivalent replacements for some of the technical features. Such modifications or replacements do not depart from the essence of the corresponding technical solutions and are still deemed to fall within the protection scope of the technical solutions of the embodiments of the present application.

What is claimed is:

1. An array substrate, comprising:

a base substrate;

a first metal layer disposed on the base substrate and comprising a common signal line;

a second metal layer disposed on one side of the first metal layer away from the base substrate and comprising a plurality of data lines;

a pixel electrode layer disposed on one side of the second metal layer away from the first metal layer and comprising a plurality of pixel electrodes; and a shielding layer, disposed between the second metal layer and the pixel electrode layer and comprising a plurality of first shielding electrodes and a plurality of second shielding electrodes arranged at intervals, wherein the first shielding electrode has a same potential as the pixel electrodes, and the second shielding electrode has a same potential as the common signal line, wherein an orthographic projection of the first shielding electrode projected on the base substrate overlaps with an orthographic projection of the pixel electrode projected on the base substrate, and an orthographic projection of the second shielding electrode projected on the base substrate covers an orthographic projection of the data line projected on the base substrate and at least partially overlaps with the orthographic projection of the pixel electrode projected on the base substrate.

2. The array substrate according to claim 1, further comprising a plurality of pixel electrode regions and at least one driving circuit region arranged on one side of each of the pixel electrode regions, wherein the pixel electrodes are disposed in the pixel electrode regions;

wherein the pixel electrode layer further comprises a connecting electrode connected to the pixel electrode and extends from the pixel electrode region to the driving circuit region, and the first shielding electrode is electrically connected to the connecting electrode in the driving circuit region.

3. The array substrate according to claim 2, wherein the first shielding electrode comprises a first sub-shielding electrode and a second sub-shielding electrode extending from one side of the first sub-shielding electrode;

the first sub-shielding electrode is arranged in the pixel electrode region, the second sub-shielding electrode is at least arranged in the driving circuit region, and the second sub-shielding electrode is electrically connected to the connecting electrode in the driving circuit region.

4. The array substrate according to claim 3, wherein the second metal layer further comprises a source and a drain disposed at intervals and arranged in each of the driving circuit regions;

the source is electrically connected to the data line, the second sub-shielding electrode is electrically connected to the drain through a first via hole, the connecting electrode contacts and connects to the second sub-shielding electrode in the first via hole through a second via hole, and the first via hole is in communication with the second via hole.

5. The array substrate according to claim 4, further comprising:

a color resist layer formed between the second metal layer and the shielding layer; and an insulation layer disposed between the shielding layer and the pixel electrode layer, wherein the first via hole extends through the color resist layer, and the second via hole extends through the insulation layer.

6. The array substrate according to claim 3, wherein the second shielding electrode comprises a third sub-shielding electrode and a fourth sub-shielding electrode, the third sub-shielding electrode and the fourth sub-shielding electrode extend in a direction parallel to the data line and are connected to the data line, the third sub-shielding electrode is arranged on one side of the pixel electrode region, and the fourth sub-shielding electrode is arranged on one side of the driving circuit region;

an orthographic projection of the third sub-shielding electrode projected on the base substrate at least partially overlaps with the orthographic projection of the pixel electrode projected on the base substrate.

7. The array substrate according to claim 6, wherein the first metal layer further comprises a plurality of scan lines, and the scan lines intersect with the data lines;

the second shielding electrode further comprises a fifth sub-shielding electrode parallel to the scan line and connected to the third sub-shielding electrode; the third sub-shielding electrode, the fourth sub-shielding electrode, and the fifth sub-shielding electrode are connected to form a grid pattern;

each of the first shielding electrodes is arranged in one grid;

wherein an orthographic projection of the fifth sub-shielding electrode projected on the base substrate covers an orthographic projection of the scan line projected on the base substrate.

8. The array substrate according to claim 7, wherein a width of an area of overlap between the orthographic projection of the third sub-shielding electrode projected on the base substrate and the orthographic projection of the pixel electrode projected on the base substrate is greater than 5 micrometers.

9. The array substrate according to claim 8, wherein a ratio of an area of the first sub-shielding electrode to an area of the pixel electrode ranges from 30% to 85%.

10. The array substrate according to claim 6, wherein a minimum spacing between the third sub-shielding electrode and the first sub-shielding electrode ranges from 4 micrometers to 10 micrometers.

11. The array substrate according to claim 1, further comprising a third via hole, wherein the second shielding electrode and the common signal line are electrically connected to each other through the third via hole.

12. A display panel, comprising:

an array substrate;

a color filter substrate disposed opposite to the array substrate; and a liquid crystal layer disposed between the array substrate and the color filter substrate, wherein the array substrate comprises:

a base substrate;

a first metal layer disposed on the base substrate and comprising a common signal line;

a second metal layer disposed on one side of the first metal layer away from the base substrate and comprising a plurality of data lines;

a pixel electrode layer disposed on one side of the second metal layer away from the first metal layer and comprising a plurality of pixel electrodes; and a shielding layer, wherein the shielding layer is disposed between the second metal layer and the pixel electrode layer and comprises a plurality of first shielding electrodes and a plurality of second shielding electrodes arranged at intervals, and the first shielding electrode has a same potential as the pixel electrode, and the second shielding electrodes has a same potential as the common signal line, wherein an orthographic projection of the first shielding electrode projected on the base substrate overlaps with an orthographic projection of the pixel electrode projected on the base substrate, and an orthographic projection of the second shielding electrode projected on the base substrate covers an orthographic projection of the data line projected on the base substrate and at least partially overlaps with the orthographic projection of the pixel electrode on the base substrate.

13. The display panel according to claim 12, wherein the array substrate further comprises a plurality of pixel electrode regions and at least one driving circuit region arranged on one side of each of the pixel electrode regions, wherein the pixel electrodes are disposed in the pixel electrode regions;

wherein the pixel electrode layer further comprises a connecting electrode connected to the pixel electrode and extends from the pixel electrode region to the driving circuit region, and the first shielding electrode is electrically connected to the connecting electrode in the driving circuit region.

14. The display panel according to claim 13, wherein the first shielding electrode comprises a first sub-shielding electrode and a second sub-shielding electrode extending from one side of the first sub-shielding electrode;

the first sub-shielding electrode is arranged in the pixel electrode region, the second sub-shielding electrode is at least arranged in the driving circuit region, and the second sub-shielding electrode is electrically connected to the connecting electrode in the driving circuit region.

15. The display panel according to claim 14, wherein the second metal layer further comprises a source and a drain disposed at intervals and arranged in each of the driving circuit regions;

the source is electrically connected to the data line, the second sub-shielding electrode is electrically connected to the drain through a first via hole, the connecting electrode contacts and connects to the second sub-shielding electrode in the first via hole through a second via hole, and the first via hole is in communication with the second via hole.

16. The display panel according to claim 15, wherein the array substrate further comprises:

a color resist layer formed between the second metal layer and the shielding layer; and an insulation layer disposed between the shielding layer and the pixel electrode layer, wherein the first via hole extends through the color resist layer, and the second via hole extends through the insulation layer.

17. The display panel according to claim 14, wherein the second shielding electrode comprises a third sub-shielding electrode and a fourth sub-shielding electrode, the third sub-shielding electrode and the fourth sub-shielding electrode extend in a direction parallel to the data line and are connected to the data line, the third sub-shielding electrode is arranged on one side of the pixel electrode region, and the fourth sub-shielding electrode is arranged on one side of the driving circuit region;

an orthographic projection of the third sub-shielding electrode projected on the base substrate at least partially overlaps with the orthographic projection of the pixel electrode projected on the base substrate.

18. The display panel according to claim 17, wherein the first metal layer further comprises a plurality of scan lines, and the scan lines intersect with the data lines;

the second shielding electrode further comprises a fifth sub-shielding electrode parallel to the scan line and connected to the third sub-shielding electrode; the third sub-shielding electrode, the fourth sub-shielding electrode, and the fifth sub-shielding electrode are connected to form a grid pattern;

each of the first shielding electrodes is arranged in one grid;

wherein an orthographic projection of the fifth sub-shielding electrode projected on the base substrate covers an orthographic projection of the scan line projected on the base substrate.

19. The display panel according to claim 18, wherein a width of an area of overlap between the orthographic projection of the third sub-shielding electrode projected on the base substrate and the orthographic projection of the pixel electrode projected on the base substrate is greater than 5 micrometers.

20. The display panel according to claim 19, wherein a ratio of an area of the first sub-shielding electrode to an area of the pixel electrode ranges from 30% to 85%.

* * * * *